United States Patent
Lee et al.

(10) Patent No.: US 10,055,524 B2
(45) Date of Patent: Aug. 21, 2018

(54) SYSTEM FOR FINITE ELEMENT MODELING AND ANALYSIS OF A STRUCTURAL PRODUCT

(71) Applicant: THE BOEING COMPANY, Chicago, IL (US)

(72) Inventors: Hangki Lee, Mill Creek, WA (US); Martin G. Andrews, Freeland, WA (US); Madhavadas Ramnath, Mukilteo, WA (US); Andrew R. Anderson, Everett, WA (US); Taeksun Nam, Woodinville, WA (US); Gerald E. Mabson, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 319 days.

(21) Appl. No.: 15/138,891

(22) Filed: Apr. 26, 2016

(65) Prior Publication Data
US 2017/0308633 A1  Oct. 26, 2017

(51) Int. Cl.
*G06F 17/50*  (2006.01)

(52) U.S. Cl.
CPC ................. *G06F 17/5018* (2013.01)

(58) Field of Classification Search
CPC ..................................................... G06F 17/50
USPC ........................................................... 703/1
See application file for complete search history.

(56) References Cited

U.S. PATENT DOCUMENTS

| | | | |
|---|---|---|---|
| 7,016,825 B1* | 3/2006 | Tryon, III | G06F 17/5018 702/182 |
| 8,525,979 B2* | 9/2013 | Lam | G01B 11/168 356/32 |
| 2006/0080069 A1* | 4/2006 | Fujimoto | G06F 17/5018 703/2 |
| 2017/0268186 A1* | 9/2017 | Thrall | E01D 15/133 |

\* cited by examiner

*Primary Examiner* — Andy Ho
(74) *Attorney, Agent, or Firm* — Womble Bond Dickinson (US) LLP

(57) ABSTRACT

An apparatus is provided for finite element modeling and analysis of a structural product. A pre-processing system may produce a finite element model of a structural product including component parts joined by a fastener. The finite element model may represent the product by respective meshes of elements including shell or solid elements for the component parts, and beam and spring elements for the fastener in which at least one spring element has an axial offset from the shell or solid elements with respect to an axis of the fastener. A processing system may perform a finite element method (FEM) failure analysis of the finite element model under an external load that is transferable from the component parts to the fastener. The FEM failure analysis may produce an output that indicates a behavior of the fastener, and the FEM failure analysis may predict a component failure rate of the fastener based on the behavior.

21 Claims, 7 Drawing Sheets

SYSTEM FOR FINITE ELEMENT MODELING AND ANALYSIS OF A STRUCTURAL PRODUCT

TECHNOLOGICAL FIELD

The present disclosure relates generally to numerical modeling and analysis and, in particular, to finite element modeling and analysis of a structural product.

BACKGROUND

Numerical modeling and analysis technology is an important tool in the design and verification of many engineered structural products and the structural components of which they are composed. One common computer-based numerical modeling and analysis technique is finite element modeling and analysis. In accordance with various numerical modeling analysis techniques, computer models may define a working environment in terms of geometry, elements, properties, loads, constraints and the like, and can thus be solved and analyzed to determine structural integrity of an engineered structural product within that working environment, for example. Through numerical modeling and analysis and in particular finite element analysis, it may be possible to break a complex system down into a manageable (finite) number of elements (e.g., a curve drawn as a series of steps). These computer models and their analysis may be used for several purposes, such as to help determine the behavior of a new airplane product design under various load environments.

Finite element analysis has often been utilized to model fasteners that join component parts of a structural product such as an aircraft. Aircraft structural analysis systems increasingly rely on the use of the finite element method as it is critical to accurately represent the physics of various fastener or joint types. However, many systems fail to accurately characterize stiffness and load distributions in joint members in multi-strap joints using finite element analysis. In addition, current systems and methods do not accurately account for the through thickness behavior of the fastener.

Therefore, it may be desirable to have a system and method that take into account at least some of the issues discussed above, as well as possibly other issues.

BRIEF SUMMARY

Example implementations of the present disclosure are directed to an improved system, method and computer-readable storage medium for finite element modeling and analysis of a structural product including component parts joined by a fastener. In particular, example implementations provide a system and finite element analysis (FEA) fastener idealization methods that utilize a unique collection of beam elements, spring elements, and complex sets of constraints for accurately simulating a bending load transfer across a wide range of joint thicknesses.

In some example implementations, a method is provided for finite element modeling and analysis of a structural product. The method may comprise producing a finite element model of a structural product including component parts joined by a fastener. The finite element model may represent the component parts and fastener by respective meshes of elements joined as are the component parts and fastener. The respective meshes of elements may include shell or solid elements for the component parts, beam elements representing a shear and bending stiffness of the fastener, and spring elements representing a bearing stiffness of the fastener. At least one spring element of the spring elements may have an axial offset from the shell or solid elements with respect to an axis of the fastener.

The method may also comprise performing a finite element method (FEM) failure analysis of the finite element model under an external load that is transferable from the component parts to the fastener, and thereby transferrable between the beam elements and spring elements. The method may also comprise producing an output that indicates a behavior of the fastener based at least in part on the axial offset of the at least one spring element. The method may also comprise predicting a component failure rate of the fastener based on the behavior.

In some example implementations of the method of the preceding or any subsequent example implementation, or any combination thereof, for a surface of a component part of the component parts represented by a respective mesh of elements of the respective meshes of elements, producing the finite element model includes adding a bearing, head or tail coupling to connect a node of the respective mesh of elements to a node of a beam element of the beam elements or a spring element of the spring elements.

In some example implementations of the method of any preceding or any subsequent example implementation, or any combination thereof, producing the finite element model includes assigning a value to at least some of the spring elements to correct for variation in bearing stiffness throughout the fastener.

In some example implementations of the method of any preceding or any subsequent example implementation, or any combination thereof, the axial offset of the at least one spring element defines a bending interaction between the fastener and at least one of the component parts.

In some example implementations of the method of any preceding or any subsequent example implementation, or any combination thereof, for a component part of the component parts represented by a respective mesh of elements of the respective meshes of elements, the shell elements of the respective mesh of elements include a reference surface that has an offset from a mid-plane of the respective mesh of elements representing the component part.

In some example implementations of the method of any preceding or any subsequent example implementation, or any combination thereof, the respective meshes of elements include solid elements and further include a virtual node surface configured to transfer load from the reference surface to the beam elements and spring elements, the virtual node surface being connected to the reference surface and located at one or more interfaces between the respective meshes of elements representing the components parts and fastener, the one or more interfaces being configured to prevent interpenetration of faying surfaces of adjacent elements of the respective meshes of elements while allowing for sliding therebetween.

In some example implementations of the method of any preceding or any subsequent example implementation, or any combination thereof, the beam elements include shear deformable beam elements that represent a shank of the fastener, and that are coupled to at least some of the shell or solid elements and spring elements.

In some example implementations, an apparatus is provided for finite element modeling and analysis of a structural product. The apparatus comprises a processor and a memory storing executable instructions that, in response to execution by the processor, cause the apparatus to implement a number of subsystems, such as a pre-processing, processing, and post-processing system that may be configured to at least perform the method of any preceding example implementation, or any combination thereof.

In some example implementations, a computer-readable storage medium is provided for finite element modeling of a fastener. The computer-readable storage medium is non-transitory and has computer-readable program code portions stored therein that, in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
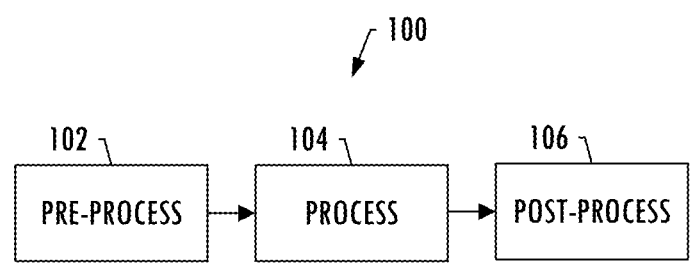
FIG. 1 is an illustration of a numerical modeling and analysis system, according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to at least processing a numerical model of a physical, structural product. Example implementations will be primarily described in conjunction with aerospace applications in which the product may be an aircraft or one or more component parts of an aircraft, such as one or more materials, components, assemblies and sub-assemblies of an aircraft. It should be understood, however, that example implementations may be utilized in conjunction with a variety of other applications, both in the aerospace industry and outside of the aerospace industry.

FIG. 1 illustrates a numerical modeling and analysis system 100 according to example implementations of the present disclosure. The numerical modeling and analysis system may be configured to perform a number of different functions or operations, either automatically, under direct operator control, or some combination of thereof. In this regard, the numerical modeling and analysis system may be configured to perform one or more of its functions or operations automatically, that is, without being directly controlled by an operator. Additionally or alternatively, the numerical modeling and analysis system may be configured to perform one or more of its functions or operations under direct operator control.

As explained in greater detail below, in some examples, the numerical modeling and analysis system 100 may be configured to develop an appropriate computer model of a structural product, perform an analysis of the structural product from the numerical model to produce data, and post-process data produced from the analysis. Example implementations may at times be particularly described in the context of a finite element model of a structural product, and performance of a finite element analysis from the finite element model. It should be understood, however, that the numerical modeling system may be configured to develop any of a number of different computer models one or more of which may not be considered a finite element model; and may be configured to perform any of a number of different analyses from the numerical model one or more of which may not be considered finite element analysis. Examples of other suitable analyses include finite difference analysis, finite volume analysis, one or more probabilistic methods, and the like.

The numerical modeling and analysis system 100 may include one or more of each of a number of different subsystems (each an individual system) coupled to one another for performing one or more functions or operations. As shown in FIG. 1, for example, the numerical modeling and analysis system may include a pre-processing system 102, processing system 104, and/or post-processing system 106 that may be coupled to one another. Although shown as part of the numerical modeling and analysis system, one or more of the pre-processing system or processing system may instead be separate from but in communication with the numerical modeling and analysis system. It should also be understood that one or more of the subsystems may function or operate as a separate system without regard to others of the subsystems. And further, it should be understood that the numerical modeling and analysis system may include one or more additional or alternative subsystems than those shown in FIG. 1.

The pre-processing system 102 may be generally configured to develop an appropriate computer model (e.g., finite element model) of a structural product. The computer model may represent the structural product by a mesh of elements although it will be readily understood by a person of ordinary skill in the art that the structural product may be represented by any zero, one, two or three dimensional element, such as a bar element for example. The elements may be or include one or more disjointed (non-overlapping) components of a mathematical model in which each element may possess a set of distinguishing points called nodal points or nodes. In some example implementations, the nodal points may be located at the corners and/or end points of the elements such that the geometry of an element may be defined by the placement of geometric sets of nodal points.

The nodal dataset for each set of nodal points may include values of a property or state of the structural product at respective nodal points of the set of nodal points. Examples of suitable properties include geometric properties and constitutive properties such as residual thickness, principal curvature, elastic modulus, thermal coefficient of expansion and the like. The constitutive properties may specify the material behavior of the structural product at respective nodal points. Examples of suitable states include state variables such as components of the derived stress and strain tensors, and temperature at the respective nodal points. This method may also be applicable to element-based datasets such as element forces, properties, and the like.

As explained in greater detail below, in accordance with example implementations of the present disclosure, the pre-processing system 102 may be generally configured to produce a finite element model of a structural product including component parts joined by a fastener. The finite element model may represent the component parts and fastener by respective meshes of elements joined as are the component parts and fastener. The respective meshes of elements may include shell or solid elements for the component parts. For the fastener, the respective meshes of elements may include beam elements representing a shear and bending stiffness of the fastener, and spring elements representing a bearing stiffness of the fastener. At least one spring element of the spring elements may have an axial offset from the shell or solid elements with respect to an axis of the fastener.

For its operations, the pre-processing system 102 may benefit from commercially-available software tools. Examples of suitable software tools include computer-aided design (CAD) systems, such as CATIA, SolidWorks or the like, available from Dassault Systèmes S.A. of Vélizy-Villacoublay, France. Other examples of suitable software tools include ABAQUS CAE available from Simulia (a subsidiary of Dassault Systemes); Altair Hypermesh, available from Altair Engineering, Inc. of Troy, Mich.; PATRAN, available from MSC Software Corporation of Newport Beach, Calif.; the ANSYS software suite, available from ANSYS, Inc. of Canonsburg, Pa.; HyperSizer®, available from Collier Research Corporation of Newport News, Va.; GENESIS, available from Vanderplaats R&D, Inc. of Colorado Springs, Colo.; and the like.

The processing system 104 may be generally configured to perform analysis of the structural product from the numerical model. The analysis of the structural product may be or include analysis via one or more algorithms (e.g., governing matrix constraints) and/or measurement-based analysis (e.g., measurement comparisons). For example, in the context of finite element analysis, the processing system may be configured to derive and solve governing matrix constraints from the numerical model. In some example implementations, the numerical model is a finite model composed of a mesh of finite elements. In other example implementations, the numerical model is a finite volume model composed of volume elements or a finite difference model composed of elements defined by a collection of nodal points. Each element may be embodied in terms of a finite number of degrees of freedom characterized as a value of an unknown function, or function, at a set of nodal points. An element may further comprise degrees of freedom (DOF) that function as a point at which two elements may be connected and specify the state of the element. The degrees of freedom may be defined as the values and/or derivatives of a state variable at connected nodal points in which a state variable may refer to a variable utilized to describe a mathematical state of a model.

As explain in greater detail below, in the context of a finite element model of a structural product including component parts joined by a fastener, the processing system 104 may be generally configured to perform a finite element method (FEM) failure analysis of the finite element model under an external load. The external load may be transferable from the component parts to the fastener, and thereby transferable between beam elements and spring elements of the finite element model. The FEM failure analysis may be configured to produce an output that indicates a behavior of the fastener based at least in part on the axial offset of the at least one spring element from shell or solid elements of the component parts. The FEM failure analysis may also be configured to predict a component failure rate of the fastener based on the behavior.

The post-processing system 106 may be configured to check the validity of the solutions from the processing system 104 (e.g., displacements, stresses, specialized stresses, error indicators); and in some examples, the post-processing system may to perform at least one other appropriate analysis on the numerical model and/or solutions.

The processing system 104 and post-processing system 106 may benefit from commercially-available software tools. Examples of suitable tools include Abaqus, available from Dassault Systèmes S.A.; the ANSYS software suite (Fluent); NASTRAN/PATRAN, available from MSC Software Corporation; SolidWorks (COSMOSworks), COMSOL Multiphysics® (FEMLAB), available from COMSOL Inc. of Burlington, Mass.; GENESIS; Altair HyperView, available from Altair Engineering, Inc.; NX (Unigraphics), available from Siemens PLM Software of Plano, Tex.; TAK 2000, available from K&K Associates of Westminster, Colo.; Pro/ENGINEER, available from PTC Inc. of Needham, Mass.; LS-DYNA®, available from Livermore Software Technology Corporation (LSTC) of Livermore, Calif.; and the like.

Figure 2A:
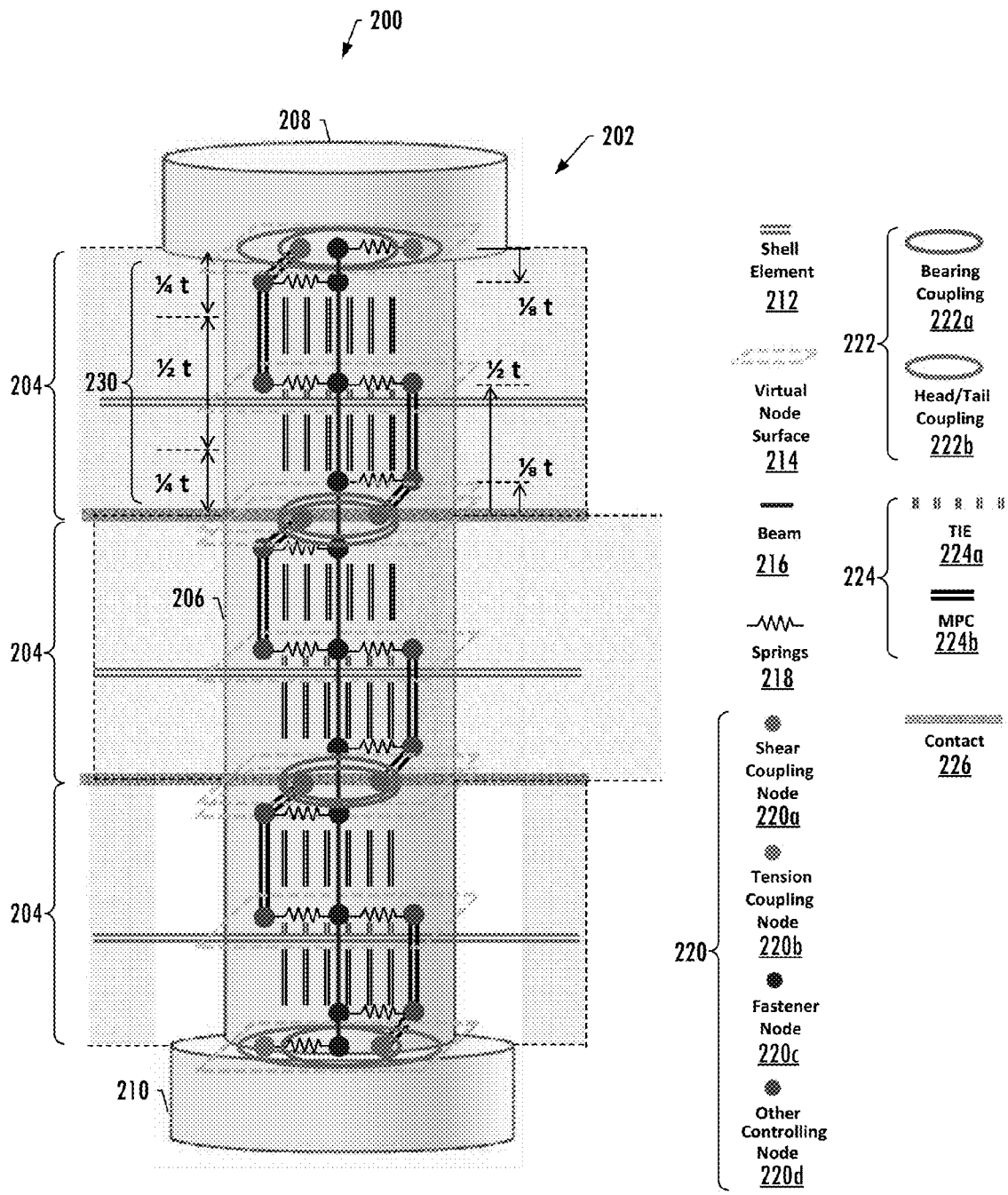
FIG. 2A depicts a finite element model of a fastener and a plurality of component parts of a structural product according to example implementations of the present disclosure.

FIG. 2A illustrates an example finite element model 200 of a fastener 202 and a plurality of component parts 204 of a structural product, according to one example implementation. In the illustrated implementations, the fastener may include a bolt having a shank 206, head 208, and/or tail 210. It should be noted however, that in some implementations, the fastener may include a number or other fastener types not explicitly expressed herein including screws, rivets, nails, pins, nuts, clamps, clasp, and the like.

As illustrated, the finite element model 200 may be defined by a mesh of finite elements including a plurality of shell 212 or solid elements (not explicitly illustrated herein), virtual node surfaces 214, beam elements 216, spring elements 218, and nodes 220. The finite element model may also be defined by a number of other components including a plurality of couplings 222, constraints 224, and contacts 226 which may be discussed in further detail hereinafter. In these implementations, the constraints including tie constraints 224a and multipoint constraints (MPC) 224b may refer to one or more equations that defined kinematic relationships between displacement degrees of freedom (DOF) such that the constraints link the motion of multiple nodes.

Referring again to FIG. 1, as previously indicated, the pre-processing system 102 may be generally configured to produce the finite element model 200 of a structural product including component parts 204 joined by a fastener 202 in which the finite element model may represent the component parts and fastener by respective meshes of elements joined as are the component parts and fastener. The respective meshes of elements representing the component parts 204 may include shell 212 or solid elements (not explicitly illustrated herein). In some examples, the shell elements may be or include a reference surface (contains meshes) that has an offset from a mid-plane of the component parts. In instances where the respective meshes of elements includes shell elements, as shown in FIG. 2A, the respective mesh of elements may also include a virtual node surface 214 that is connected to the reference surface of the shell element by a TIE 224a and among them by MPCs 224b. The architecture is configured to transfer load from the reference surface to the beam elements 216 and spring elements 218 during analysis of the finite element model.

Figure 2B:
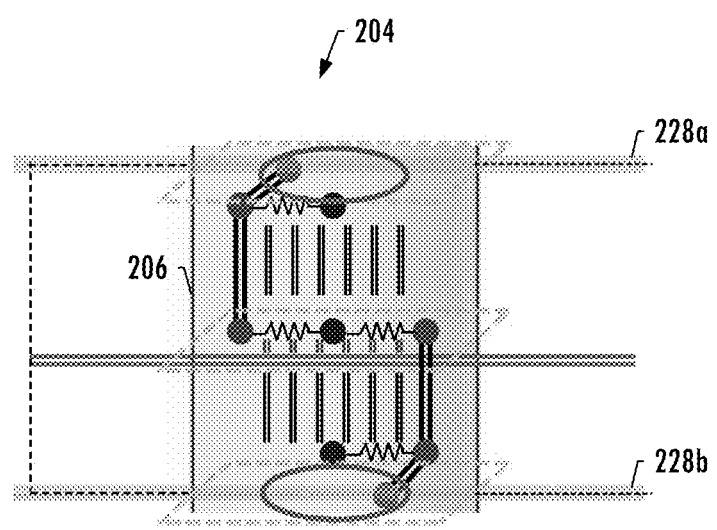
FIG. 2B depicts a portion of the finite element model of FIG. 2A representing a portion of the fastener and a component part, according to example implementations of the present disclosure.

The virtual node surface 214 may be connected to the reference surface of the shell element 212 and located at the one or more interfaces or contacts 226 between the respective mesh of elements representing the component parts 204 and the fastener 202. As such, the shell elements and corresponding virtual node surfaces may collectively represent or simulate a physical thickness of the component part in which the virtual node surfaces may virtually recreate top 228a and bottom 228b surfaces of the component part, as shown in FIG. 2B, and thereby create a virtual three-dimensional (3D) component part.

It should be noted that although the illustrated examples specifically utilize a combination of shell elements 212 and virtual node surfaces 214 for representing the component parts 204, in some examples, the illustrated combination of shell elements and virtual node surfaces may instead imply solid elements (or a stack of solid elements) for representing the component parts. The solid elements may exclude a need to virtually represent the top 228a and bottom 228b surfaces of the component parts as the solid elements are 3D representations of the component part, including the surfaces thereof. In particular, one or more layers of solid elements may be utilized in lieu of virtual node surfaces as the solid elements have physical nodes of a faying surface that represent corresponding surfaces of the component parts. The surfaces of the solid elements may transfer load from the respective mesh of elements representing the component parts to the beam elements 216 and spring elements 218 during analysis of the finite element model.

In some example implementations, an interface or contact 226 may define a mechanism configured to prevent interpenetration of faying surfaces of at least two adjacent meshes of elements, comprised of either shell or solid elements, while allowing for sliding between the component faying surfaces.

The respective meshes of elements may also include beam elements 216 and spring elements 218 for the fastener 202. The beam elements may represent a shear and bending stiffness of the fastener. In some examples, the beam elements may be or include shear deformable beam elements that represent a shank 206 of the fastener. The spring elements may represent a bearing stiffness of the fastener.

At least one spring element 218 may have an axial offset 230 from a mid-plane of a mesh of elements (e.g., shell elements 212 connected to virtual node surfaces 214, or a stack of solid elements) representing a component part 204. In these examples, the axial offset may be with respect to an axis of the fastener. In some examples, the axial offset of the at least one spring element may define a bending interaction between the fastener 202 and at least one of the component parts 204. In particular, the axial offset may define the bending interaction of the fastener and the component thickness of the at least one of the component parts.

The pre-processing system 102 may also be configured to assign a value to at least some of the spring elements 218 to correct for variation in bearing stiffness throughout the fastener 202. For example, a bearing stiffness of the spring element may be tailored to automatically compensate for variation in joint stiffness due to finite element discretization. As opposed to manual calibrations, the system may efficiently assign values for a substantial number of fasteners and/or even for moderately complex joints.

In some example implementations, for each respective mesh of elements representing a component part 204 (e.g., shell elements 212 connected to virtual node surfaces 214, or solid elements that in some examples may include a stack of solid elements) or more particularly a surface of the component part, the pre-processing system 102 may be configured to add a plurality of couplings 222 within the finite element model 200 to respectively connect nodes 220a, 220b of elements representing a surface of the component part to fastener nodes 220c or other controlling nodes 220d (e.g., spring or MPC nodes).

The couplings 222 may include a plurality of bearing couplings 222a and/or head/tail couplings 222b respectively within the shank 206, head 208, and/or tail 210 of the fastener 202. As previously indicated, the beam elements 216 may be or include shear deformable beam elements that represent the shank of the fastener. In these examples, the beam elements may be coupled to at least some of the elements representing a surface of the component part 204 and spring elements 218. Thus, the nodes may include a plurality of shear coupling nodes 220a, tension coupling nodes 220b, fastener nodes 220c, and/or other controlling nodes 220d.

Figure 3A:
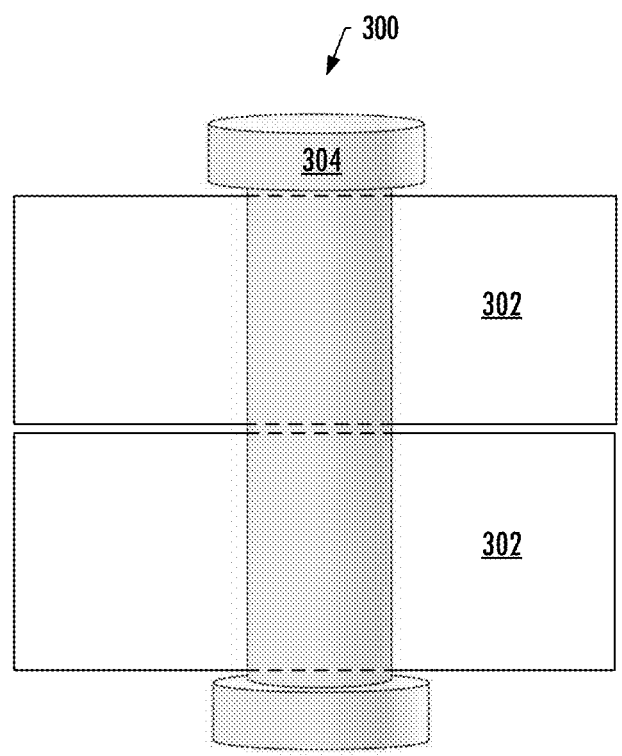
FIG. 3A depicts a structural product, according to one example implementation.
Figure 3B:
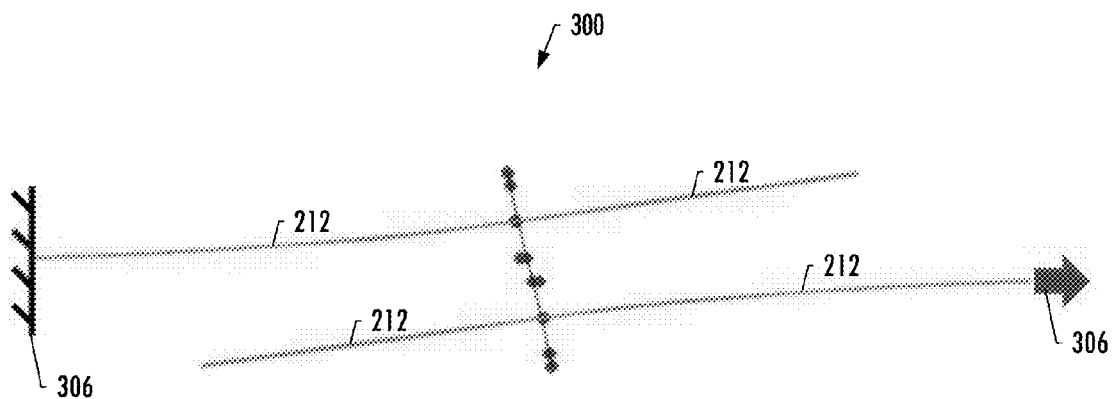
FIGS. 3B and 3C depict a finite element representation of the structural product of FIG. 3A under an external load, according to one example implementation.
Figure 3C:
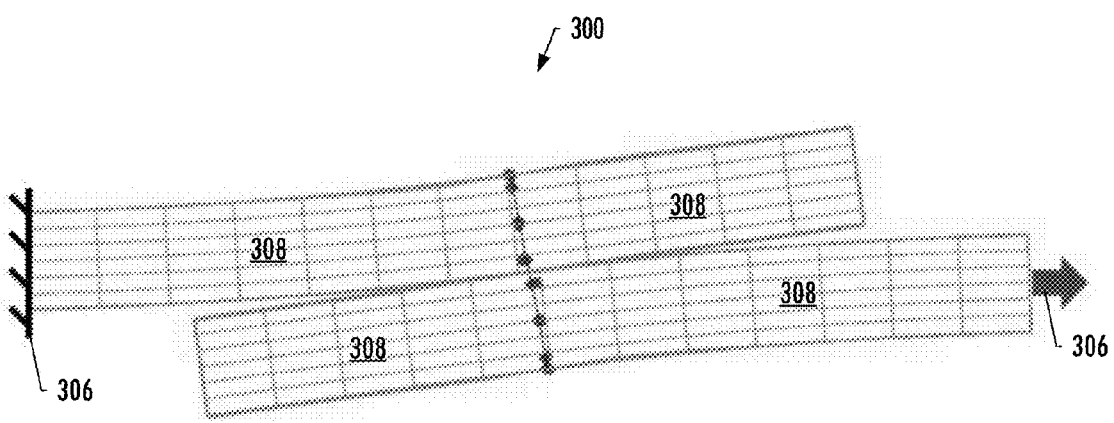

The processing system 104 may be configured to perform a FEM failure analysis of the finite element model. FIG. 3A illustrates a structural product 300 including component parts 302 joined by a fastener 304. FIGS. 3B and 3C illustrate a finite element representation of the structural product 300 under an external load, and representing the component parts respectively using shell elements 212 and solid elements 308 according to example implementations. As shown, the analysis may include the application of an external load 306 that is transferable from the component parts 302 to the fastener 304 at various locations. Within the finite element model 200, the external load may thereby be transferrable between the beam elements 216 and spring elements 218. In some examples, multiple compliance terms may contribute to an overall joint stiffness of the fastener. Thus, the processing system may be configured to account for various factors including translational component part (e.g., plates) bearing stiffness, translational fastener bearing stiffness, rotational plate bearing stiffness, rotational fastener bearing stiffness, fastener shear stiffness (throughout the entire thickness), fastener bending stiffness (throughout the entire thickness), translational fastener head/tail stiffness, rotational fastener head/tail bearing stiffness, and out-of-plane consideration.

The FEM failure analysis may be configured to produce an output that indicates a behavior of the fastener 202 based at least in part on the axial offset 230 of at least one spring element 218. The FEM failure analysis may also be configured to predict a component failure rate of the fastener based on the behavior. In some example implementations, the system may be utilized in conjunction with a system for designing, testing, and/or manufacturing structural products. In these examples, the processing system 104 may be configured to indicate whether or not a structural product, one or more of its component parts or the fastener should be rejected or accepted based at least in part on the behavior of the fastener or predicted component failure rate during analysis. In some examples, the processing system may trigger acceptance or rejection of the structural product, one or more of its component parts or the fastener.

Figure 4:
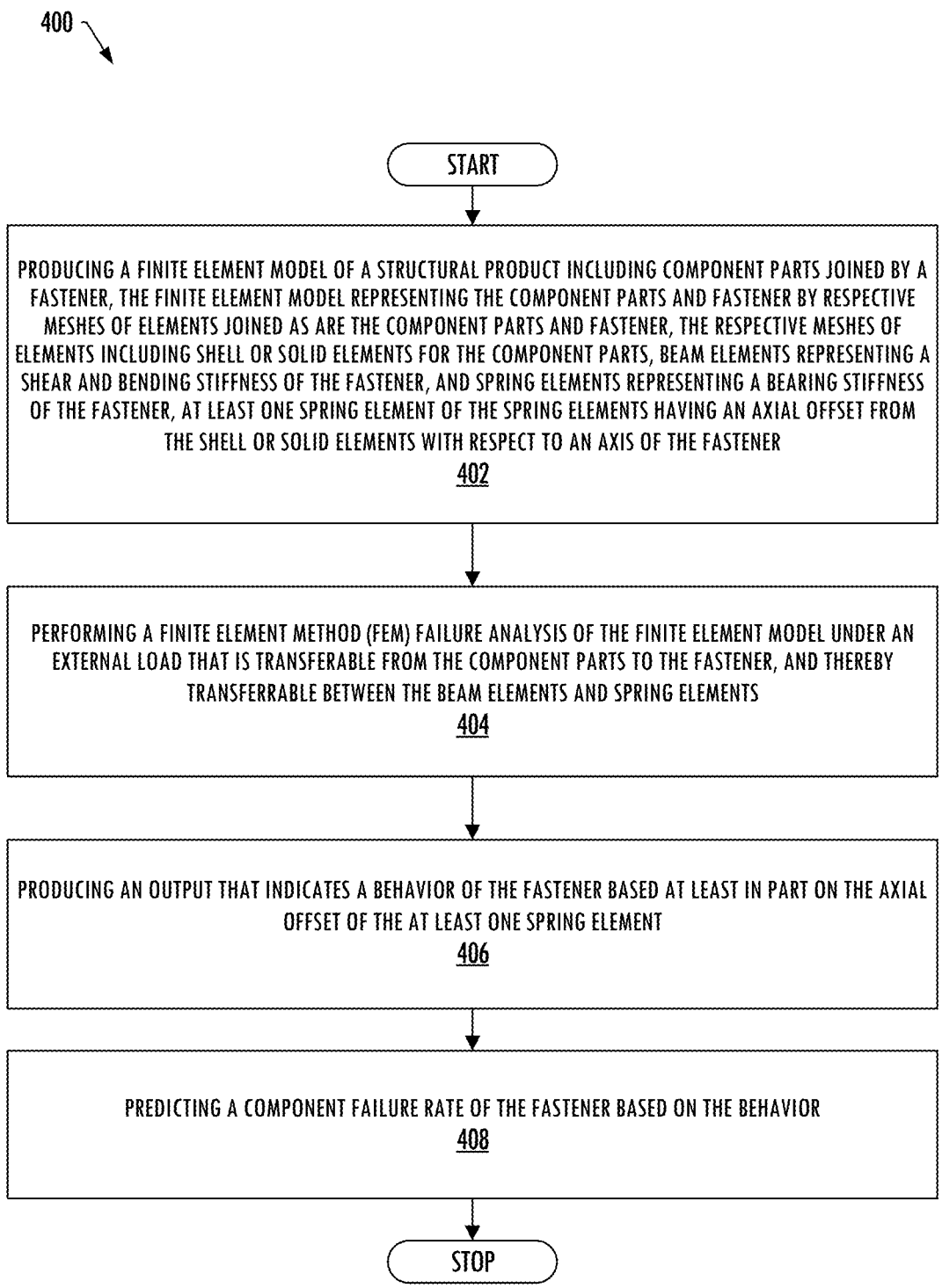
FIG. 4 is a flow diagram illustrating various operations of a method for at least post processing a finite element model, in accordance with an example implementation.

FIG. 4 illustrates a flowchart including various operations of a method 400 for finite element modeling of a fastener in accordance with an example implementation of the present disclosure. As shown at block 402, the method may include producing a finite element model of a structural product including component parts joined by a fastener. The finite element model may represent the component parts and fastener by respective meshes of elements joined as are the component parts and fastener. The respective meshes of elements may include shell or solid elements for the component parts. For the fastener, the respective meshes of elements may include beam elements representing a shear and bending stiffness of the fastener, and spring elements representing a bearing stiffness of the fastener. At least one spring element of the spring elements may have an axial offset from the shell or solid elements with respect to an axis of the fastener. The method may include performing a finite element method (FEM) failure analysis of the finite element model under an external load. The external load may be transferable from the component parts to the fastener, and thereby transferrable between the beam elements and spring elements, as shown at block 404. The method may also include producing an output that indicates a behavior of the fastener based at least in part on the axial offset of the at least one spring element, as shown at block 406. As shown at block 408, the method may include predicting a component failure rate of the fastener based on the behavior.

According to example implementations of the present disclosure, the system 100 and its subsystems and/or components including the pre-processing system 102, processing system 104, and/or post-processing system 106 may be implemented by various means. Means for implementing the systems, subsystems and their respective elements may include hardware, alone or under direction of one or more computer programs from a computer-readable storage medium.

In some examples, one or more apparatuses may be provided that are configured to function as or otherwise implement the systems, subsystems, tools and respective elements shown and described herein. In examples involving more than one apparatus, the respective apparatuses may be connected to or otherwise in communication with one another in a number of different manners, such as directly or indirectly via a wired or wireless network or the like.

Figure 5:
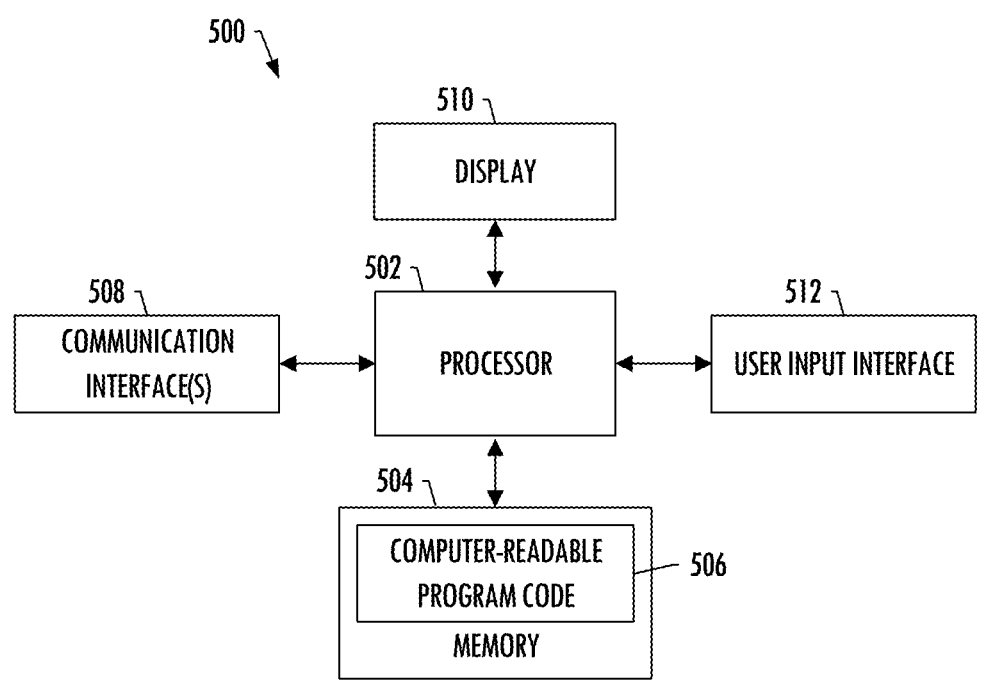
FIG. 5 illustrates an apparatus according to some example implementations.

FIG. 5 illustrates an apparatus 500 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 502 (e.g., processor unit) connected to a memory 504 (e.g., storage device).

The processor 502 is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 504 (of the same or another apparatus).

The processor 502 may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory 504 is generally any piece of computer hardware that is capable of storing information such as, for example, data, computer programs (e.g., computer-readable program code 506) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk—read only memory (CD-ROM), compact disk—read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 510 and/or one or more user input interfaces 512 (e.g., input/output unit). The display may be configured to present or otherwise display information to a user, suitable examples of which include a liquid crystal display (LCD), light-emitting diode display (LED), plasma display panel (PDP) or the like.

The user input interfaces 512 may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 500 may include a processor 502 and a computer-readable storage medium or memory 504 coupled to the processor, where the processor is configured to execute computer-readable program code 506 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for finite element modeling and analysis of a structural product, the apparatus comprising a processor and a memory storing executable instructions that, in response to execution by the processor, cause the apparatus to implement at least:

a pre-processing system configured to produce a finite element model of a structural product including component parts joined by a fastener, the finite element model representing the component parts and fastener by respective meshes of elements joined as are the component parts and fastener, the respective meshes of elements including shell or solid elements for the component parts, beam elements representing a shear and bending stiffness of the fastener, and spring elements representing a bearing stiffness of the fastener, at least one spring element of the spring elements having an axial offset from the shell or solid elements with respect to an axis of the fastener; and a processing system configured to perform a finite element method (FEM) failure analysis of the finite element model under an external load that is transferable from the component parts to the fastener, and thereby transferrable between the beam elements and spring elements, the FEM failure analysis being configured to produce an output that indicates a behavior of the fastener based at least in part on the axial offset of the at least one spring element, and the FEM failure analysis being configured to predict a component failure rate of the fastener based on the behavior.

2. The apparatus of claim 1, wherein for a surface of a component part of the component parts represented by a respective mesh of elements of the respective meshes of elements, the pre-processing system being configured to produce the finite element model includes being configured to add a bearing, head or tail coupling to connect a node of the respective mesh of elements to a node of a beam element of the beam elements or a spring element of the spring elements.

3. The apparatus of claim 1, wherein the pre-processing system being configured to produce the finite element model includes being configured to assign a value to at least some of the spring elements to correct for variation in bearing stiffness throughout the fastener.

4. The apparatus of claim 1, wherein the axial offset of the at least one spring element defines a bending interaction between the fastener and at least one of the component parts.

5. The apparatus of claim 1, wherein for a component part of the component parts represented by a respective mesh of elements of the respective meshes of elements, the shell elements of the respective mesh of elements include a reference surface that has an offset from a mid-plane of the respective mesh of elements representing the component part.

6. The apparatus of claim 5, wherein the respective meshes of elements include solid elements and further include a virtual node surface configured to transfer load from the reference surface to the beam elements and spring elements, the virtual node surface being connected to the reference surface and located at one or more interfaces between the respective meshes of elements representing the components parts and fastener, the one or more interfaces being configured to prevent interpenetration of faying surfaces of adjacent elements of the respective meshes of elements while allowing for sliding therebetween.

7. The apparatus of claim 1, wherein the beam elements include shear deformable beam elements that represent a shank of the fastener, and that are coupled to at least some of the shell or solid elements and spring elements.

8. A method for finite element modeling and analysis of a structural product, the method comprising:
producing a finite element model of a structural product including component parts joined by a fastener, the finite element model representing the component parts and fastener by respective meshes of elements joined as are the component parts and fastener, the respective meshes of elements including shell or solid elements for the component parts, beam elements representing a shear and bending stiffness of the fastener, and spring elements representing a bearing stiffness of the fastener, at least one spring element of the spring elements having an axial offset from the shell or solid elements with respect to an axis of the fastener;
performing a finite element method (FEM) failure analysis of the finite element model under an external load that is transferable from the component parts to the fastener, and thereby transferrable between the beam elements and spring elements;
producing an output that indicates a behavior of the fastener based at least in part on the axial offset of the at least one spring element; and predicting a component failure rate of the fastener based on the behavior.

9. The method of claim 8, wherein for a surface of a component part of the component parts represented by a respective mesh of elements of the respective meshes of elements, producing the finite element model includes adding a bearing, head or tail coupling to connect a node of the respective mesh of elements to a node of a beam element of the beam elements or a spring element of the spring elements.

10. The method of claim 8, wherein producing the finite element model includes assigning a value to at least some of the spring elements to correct for variation in bearing stiffness throughout the fastener.

11. The method of claim 8, wherein the axial offset of the at least one spring element defines a bending interaction between the fastener and at least one of the component parts.

12. The method of claim 8, wherein for a component part of the component parts represented by a respective mesh of elements of the respective meshes of elements, the shell elements of the respective mesh of elements include a reference surface that has an offset from a mid-plane of the respective mesh of elements representing the component part.

13. The method of claim 12, wherein the respective meshes of elements include solid elements and further include a virtual node surface configured to transfer load from the reference surface to the beam elements and spring elements, the virtual node surface being connected to the reference surface and located at one or more interfaces between the respective meshes of elements representing the components parts and fastener, the one or more interfaces being configured to prevent interpenetration of faying surfaces of adjacent elements of the respective meshes of elements while allowing for sliding therebetween.

14. The method of claim 8, wherein the beam elements include shear deformable beam elements that represent a shank of the fastener, and that are coupled to at least some of the shell or solid elements and spring elements.

15. A computer-readable storage medium for finite element modeling and analysis of a structural product, the computer-readable storage medium being non-transitory and having computer-readable program code portions stored therein that in response to execution by a processor, cause an apparatus to at least:
produce a finite element model of a structural product including component parts joined by a fastener, the finite element model representing the component parts and fastener by respective meshes of elements joined as are the component parts and fastener, the respective meshes of elements including shell or solid elements for the component parts, beam elements representing a shear and bending stiffness of the fastener, and spring elements representing a bearing stiffness of the fastener, at least one spring element of the spring elements having an axial offset from the shell or solid elements with respect to an axis of the fastener;
perform a finite element method (FEM) failure analysis of the finite element model under an external load that is transferable from the component parts to the fastener, and thereby transferrable between the beam elements and spring elements;
produce an output that indicates a behavior of the fastener based at least in part on the axial offset of the at least one spring element; and
predict a component failure rate of the fastener based on the behavior.

16. The computer-readable storage medium of claim 15, wherein for a surface of a component part of the component parts represented by a respective mesh of elements of the respective meshes of elements, the apparatus being caused to produce the finite element model includes being caused to add a bearing, head or tail coupling to connect a node of the respective mesh of elements to a node of a beam element of the beam elements or a spring element of the spring elements.

17. The computer-readable storage medium of claim 15, wherein the apparatus being caused to produce the finite element model includes being caused to assign a value to at least some of the spring elements to correct for variation in bearing stiffness throughout the fastener.

18. The computer-readable storage medium of claim 15, wherein the axial offset of the at least one spring element defines a bending interaction between the fastener and at least one of the component parts.

19. The computer-readable storage medium of claim 15, wherein for a component part of the component parts represented by a respective mesh of elements of the respective meshes of elements, the shell elements of the respective mesh of elements include a reference surface that has an offset from a mid-plane of the respective mesh of elements representing the component part.

20. The computer-readable storage medium of claim 19, wherein the respective meshes of elements include solid elements and further include a virtual node surface configured to transfer load from the reference surface to the beam elements and spring elements, the virtual node surface being connected to the reference surface and located at one or more interfaces between the respective meshes of elements representing the components parts and fastener, the one or more interfaces being configured to prevent interpenetration of faying surfaces of adjacent elements of the respective meshes of elements while allowing for sliding therebetween.

21. The computer-readable storage medium of claim 15, wherein the beam elements include shear deformable beam elements that represent a shank of the fastener, and that are coupled to at least some of the shell or solid elements and spring elements.

* * * * *